US010193438B2

(12) United States Patent
Mohan

(10) Patent No.: US 10,193,438 B2
(45) Date of Patent: Jan. 29, 2019

(54) METHOD FOR MEASURING POWER FACTOR CORRECTING (PFC) POWER SUPPLY INPUT POWER USING A SINGLE SECONDARY SIDE MEASUREMENT WITH PERIODIC USAGE METRICS

(71) Applicant: ERP POWER, LLC, Moorpark, CA (US)

(72) Inventor: James H. Mohan, Valencia, CA (US)

(73) Assignee: ERP POWER, LLC, Moorpark, CA (US)

( * ) Notice: Subject to any disclaimer, the term of this patent is extended or adjusted under 35 U.S.C. 154(b) by 0 days.

(21) Appl. No.: 15/960,247

(22) Filed: Apr. 23, 2018

(65) Prior Publication Data
US 2018/0309359 A1 Oct. 25, 2018

Related U.S. Application Data

(60) Provisional application No. 62/488,686, filed on Apr. 21, 2017.

(51) Int. Cl.
| | |
|---|---|
| *H02M 1/42* | (2007.01) |
| *G05F 1/70* | (2006.01) |
| *G01R 21/06* | (2006.01) |
| *G01R 21/133* | (2006.01) |

(52) U.S. Cl.
CPC .......... *H02M 1/4208* (2013.01); *G01R 21/06* (2013.01); *G01R 21/133* (2013.01); *G05F 1/70* (2013.01)

(58) Field of Classification Search
CPC .......... H02M 3/07; H02M 3/073; H02M 7/10; H02M 7/103; H02M 7/106
See application file for complete search history.

(56) References Cited

U.S. PATENT DOCUMENTS

| | | | |
|---|---|---|---|
| 5,132,610 A | 7/1992 | Ying-Chang | |
| 9,523,756 B2 | 12/2016 | Sun | |
| 2008/0106241 A1 | 5/2008 | Deaver et al. | |
| 2009/0306914 A1 | 12/2009 | Cohen | |
| 2012/0068544 A1 | 3/2012 | Bushue et al. | |

OTHER PUBLICATIONS

International Search Report and Written Opinion issued in corresponding PCT Application No. PCT/US18/28941, dated Jul. 5, 2018, 7 pages.

*Primary Examiner* — Adolf Berhane
*Assistant Examiner* — Afework Demisse
(74) *Attorney, Agent, or Firm* — Lewis Roca Rothgerber Christie LLP

(57) ABSTRACT

A method of monitoring a power factor correcting (PFC) power supply is provided. The method includes: powering on the PFC power supply with a constant current; starting a runtime counter that increments a count value; measuring an output voltage; calculating an output power by multiplying the constant current by the output voltage; storing the output power in a random-access memory (RAM); calculating an input power by multiplying the output power by an efficiency curve factor; and storing the input power in the RAM.

18 Claims, 3 Drawing Sheets

METHOD FOR MEASURING POWER FACTOR CORRECTING (PFC) POWER SUPPLY INPUT POWER USING A SINGLE SECONDARY SIDE MEASUREMENT WITH PERIODIC USAGE METRICS

CROSS-REFERENCE TO RELATED APPLICATIONS

This utility patent application claims priority to and the benefit of U.S. Provisional Application No. 62/488,686 filed on Apr. 21, 2017, entitled Method for Measuring Power Factor Correcting (PFC) Power Supply Input Power Using a Single Secondary Side Measurement with Periodic Usage, the entire contents of which is incorporated herein by reference.

FIELD

One or more aspects of embodiments according to the present invention relate to measuring power and, more particularly, to measuring power-factor-correcting (PFC) power supply input power.

BACKGROUND

Some related art methods of taking digital power measurements use non-rectified input current and input voltage. The directly measured signals are then converted from analog to digital, allowing a microprocessor to calculate average power using root-mean-square current and voltage.

Other related art methods use primary side input power which can be measured for power factor correcting (PFC) power supplies. Rectified input voltage and current to the PFC stage are measured using a current sensor and voltage sensor. A correction factor is applied to compensate for any phase shift introduced by current sensing.

Still other related art methods use the input power of a power factor correcting power supply, which can be measured, by monitoring only the output current of the power supply at a known output voltage level. A look up table or correction factor is applied, using previously known operating parameters, to extrapolate the input power. Output power is divided by the known efficiency value of the input section.

SUMMARY

Aspects of embodiments according to the present invention relate to a method for measuring power factor correcting (PFC) power supply input power, using a single secondary side measurement with periodic usage metrics. This method may be used in microprocessor-based LED driver products.

According to an aspect of the present disclosure, a method of monitoring a power factor correcting (PFC) power supply is provided. The method includes powering on the PFC power supply with a constant current; starting a runtime counter that increments a count value; measuring an output voltage; calculating an output power by multiplying the constant current by the output voltage; storing the output power in a random-access memory (RAM); calculating an input power by multiplying the output power by an efficiency curve factor; and storing the input power in the RAM.

In some embodiments, the PFC power supply comprises a non-volatile memory; and

In some embodiments, when the count value reaches a set number of counts, the method further includes calculating an output energy by multiplying the output power by the count value; and calculating an input energy by multiplying the input power by the count value.

In some embodiments, the method includes determining whether an output energy value and an input energy value are stored in the non-volatile memory.

In some embodiments, the method includes, upon determining that the output energy value and the input energy value are not stored in the non-volatile memory storing the output energy as the output energy value in the non-volatile memory; and storing the input energy as the input energy value in the non-volatile memory.

In some embodiments, the method includes, upon determining that the output energy value and the input energy value are stored in the non-volatile memory adding the output energy to the output energy value and storing as the output energy value in the non-volatile memory; and adding the input energy to the input energy value and storing as the input energy value in the non-volatile memory.

In some embodiments, the method includes measuring a dimming level, wherein calculating the output power comprises multiplying the dimming level by a product of the multiplying of the constant current by the output voltage.

In some embodiments, the method includes determining whether an analog-to-digital (A/D) update interrupt flag is present; and upon determining that the A/D update interrupt flag is not present, repeating the calculating the output power, storing the output power, calculating the input power, and storing the input power.

In some embodiments, the method includes communicating the output energy value or the input energy value to an energy consumption monitoring system.

In some embodiments, measuring the output voltage is measuring a voltage applied to a load.

According to another aspect of the present disclosures, a power factor correcting (PFC) power supply is provided. The PFC power supply includes a power supply configured to receive an AC input at a primary side and generate a supply voltage at a secondary side; and a controller configured to control the level of the supply voltage generated by the power supply. The controller is configured to power on the PFC power supply with a constant current; start a runtime counter that increments a count value; measure an output voltage; calculate an output power by multiplying the constant current by the output voltage; store the output power in a random-access memory (RAM); calculate an input power by multiplying the output power by an efficiency curve factor; and store the input power in the RAM.

In some embodiments, the PFC power supply includes a non-volatile memory, wherein when the count value reaches a set number of counts, the controller is configured to: calculate an output energy by multiplying the output power by the count value; and calculate an input energy by multiplying the input power by the count value.

In some embodiments, the controller is further configured to determine whether an output energy value and an input energy value are stored in the non-volatile memory.

In some embodiments, the controller is further configured to, upon determining that the output energy value and the input energy value are not stored in the non-volatile memory store the output energy as the output energy value in the non-volatile memory; and store the input energy as the input energy value in the non-volatile memory.

In some embodiments, the controller is further configured to, upon determining that the output energy value and the input energy value are stored in the non-volatile memory add the output energy to the output energy value and store the result as the output energy value in the non-volatile memory; and add the input energy to the input energy value and store the result as the input energy value in the non-volatile memory.

In some embodiments, the controller is further configured to measure a dimming level, wherein calculating the output power comprises multiplying the dimming level by a product of the multiplying of the constant current by the output voltage.

In some embodiments, the controller is further configured to determine whether an analog-to-digital (A/D) update interrupt flag is present; and upon determining that the A/D update interrupt flag is not present, repeat calculating the output power, storing the output power, calculating the input power, and storing the input power.

In some embodiments, the controller is further configured to communicate the output energy value or the input energy value to an energy consumption monitoring system.

In some embodiments, measuring the output voltage is measuring a voltage applied to a load.

BRIEF DESCRIPTION OF THE DRAWINGS

These and other features and aspects of the present invention will be appreciated and understood with reference to the specification, claims, and appended drawings wherein:

DETAILED DESCRIPTION

Aspects of embodiments according to the present invention relate to a method for measuring power factor correcting (PFC) power supply input power, using a single secondary side measurement with periodic usage metrics. This method may be used in microprocessor-based LED driver products.

The detailed description set forth below in connection with the appended drawings is intended as a description of exemplary embodiments of the present invention provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
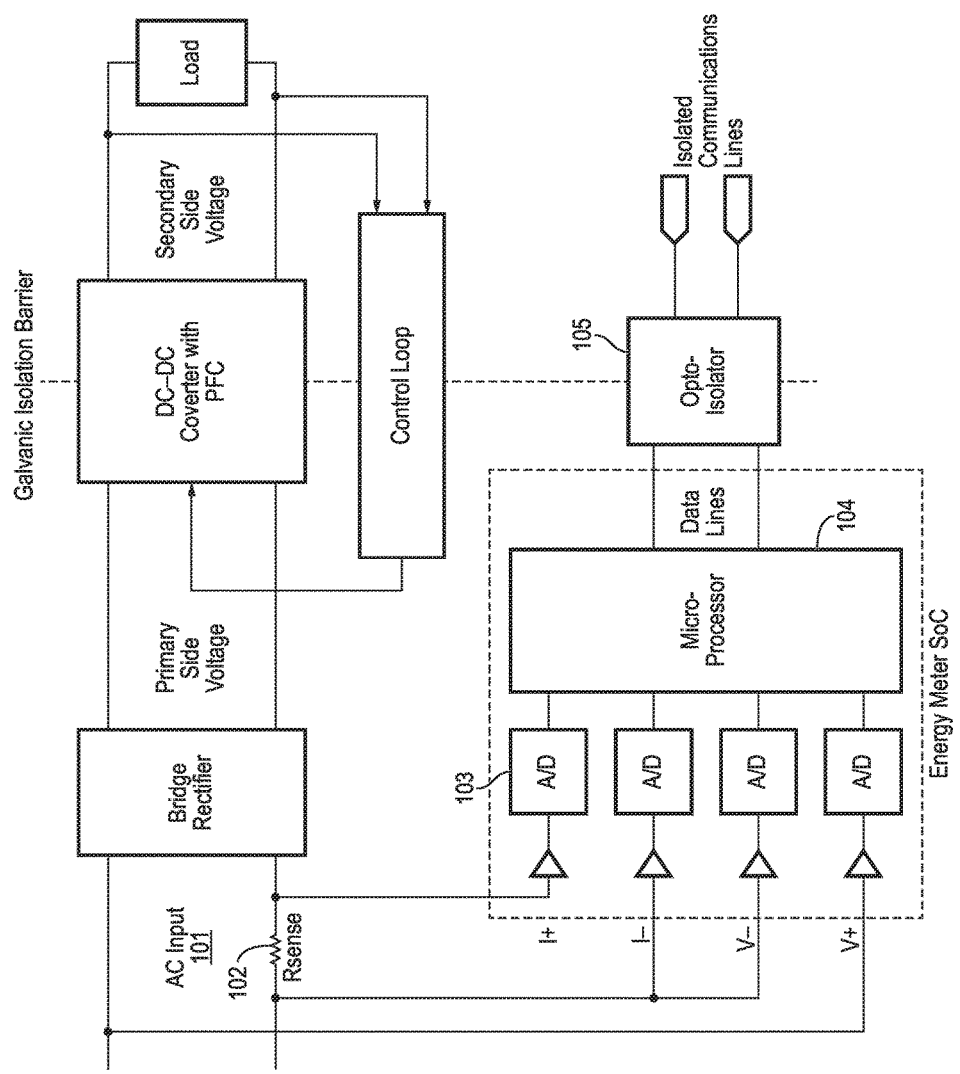
FIG. 1 is a related art digital power meter for use with a power supply.

FIG. 1 is a related art digital power meter for use with a power supply. In the related art digital power metering for power supplies of FIG. 1, input AC current and input AC voltage, prior to rectification (101), are measured directly.

An expensive inductive current sensing element or lossy sense resistor (102) are used to measure current. These measurements are then digitized using ultra-sensitive analog-to-digital (A/D) converters (103).

After A/D conversion, the digital signals can then be processed, by a low power microprocessor (104), allowing input power and energy to be calculated. Once this information is calculated, it is then transmitted across isolation barriers, often using opto-isolators (105), to be usable by the end customer.

Figure 2:
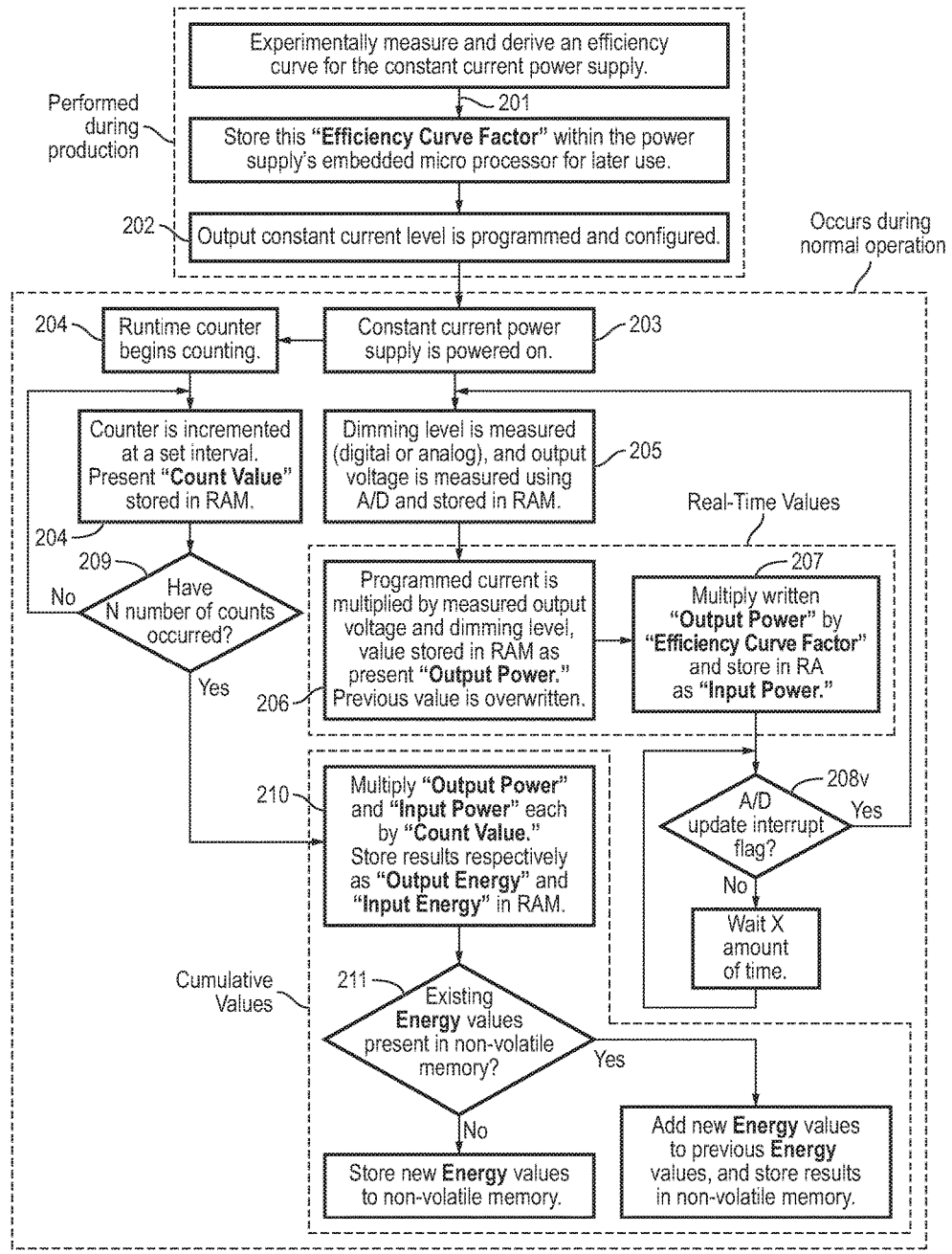
FIG. 2 is a flow chart illustrating a method according to an embodiment of the present invention.

FIG. 2 is a flow chart illustrating a method according to an embodiment of the present invention. To determine the input power and energy being consumed by a micro-processor controlled constant current power supply; various pieces of information and at least one assumption are utilized.

A power supply efficiency curve and corrective factor are experimentally determined according to one or more exemplary embodiments. An efficiency curve and corrective factor are generated, and stored within the microprocessor controller in the power supply. This efficiency corrective factor can be used to translate output power measurements into input power measurements.

Real-time output voltage of the power supply is measured. Using an A/D converter, the operating output voltage is measured. This signal may already be used for regulation purposes for normal operation; and thus no extra hardware or wiring may be used.

In dimming applications, a dimming level is measured. For applications that require dimming, an analog or digital control signal is used to dim the output current of the power supply. This control signal may also already be used for normal operation.

A constant current value is programmed. A digitally controlled constant current power supply may be specified by the programming. The microprocessor based controller regulates the output current and thus the output current may be a known value.

Active run-time data is logged and used to determine how long a period of time the power supply has been operational, and is thus used to calculate the consumed energy.

It is assumed that a high power factor correction is utilized. A high power factor correction is utilized in order to accurately translate output power to input power.

FIG. 2 illustrates how input power and energy are calculated according to one or more exemplary embodiments. Referring to FIG. 2, a large sample of power supplies are measured, and an efficiency curve, with corrective factors and dependent upon output loading conditions, is generated. These corrective factors are then stored within non-volatile memory of the microprocessor. The stored corrective factors are later utilized in calculating input power and energy consumption (201). Prior to operation and installation, the power supply is programmed with its configured constant current level (202).

The power supply is installed, and powered on (203). In parallel, the run-time counter begins incrementing (204), and a real-time output voltage and a dimming control level are measured (205). Each of these measured values (i.e., the real-time output voltage and the dimming control level) is retained in random-access memory (RAM).

The programmed output current value is then multiplied by the output voltage and dimming level, to calculate the real-time output power (206). This resulting value (i.e., the real-time output power) is also stored in the RAM. The real-time output power is then multiplied by the efficiency corrective factor, yielding the present input power. This resulting value (i.e., the present input power) is also stored in the RAM (207). Further, the microprocessor checks to see if it has an update flag for the analog-to-digital (A/D) monitoring of the output voltage and the dimming line signals (208). If a flag is present, the microprocessor returns to step 205. If no flag is present, the microprocessor will wait a set amount of time (e.g., X amount of time) for an update, retaining the previously measured values for Output Power and Input Power in the RAM. X may be an integer and be measured in minutes, seconds, milliseconds, etc.

In parallel, the run-time counter continues incrementing. After every increment, the current count value is compared against a set threshold of counts (e.g., N counts, where N is an integer) (209). If this threshold is not met, the run-time counter continues incrementing. If the threshold is met, the microprocessor multiplies each of the output power and the input power by the present count value and stores the results in the RAM as output energy and input energy, respectively (210). The microprocessor will then check the non-volatile memory for any previously stored energy values and count values (211). If values are present, they will be added to the new energy and count values and the results will be stored in the non-volatile memory. If no values are present, the new energy and count values are stored in the non-volatile memory.

The end user can now be sent the retained output energy, input energy, and consumption values that are stored in the non-volatile memory within the microprocessor. The end user may also retrieve the retained output energy, input energy, and consumption values that are stored in the non-volatile memory within the microprocessor. Using wired or wireless communication protocols, the microprocessor reaches out to a designated portal. Input energy consumption and average power consumption, over a given time interval (daily, weekly, monthly) can be presented to the user via the designated portal.

Embodiments of the present invention may drastically reduce the number of components utilized for measuring input power and energy consumption, and thus a significant cost reduction may be realized. Existing components in the control loop for the constant power supply may be repurposed. Embodiments of the present invention may utilize high power-factor correcting power supplies, with known efficiency curves, and programmable constant current output, allowing for accurate extrapolation of input power.

The only variable elements may be the output voltage of the power supply and, for dimmed lighting applications, the present dimmer level. Both dimmer level, and measured output voltage level signals may already be available for regulation purposes, thus, no extra components may be used (or needed) for power measurement and calculation.

Since all measurements are performed on the secondary side according to one or more exemplary embodiments, no isolation is used (or necessary) to configure regular energy consumption metrics, which can be periodically sent to the end user at a specified interval.

As such, embodiments of the present invention provide for real-time power consumption without added components. Further, embodiments of the present invention disclose recording of energy consumption in non-volatile memory, for future data retrieval, and data preservation in the event of power loss.

Periodic energy consumption updates can be sent to the end user using wired or wireless communication protocols to a designated local or web based portal.

Further, embodiments of the present invention disclose low processing and pin count requirements and allows the end user to tailor their usage needs based on their energy consumption.

Figure 3:
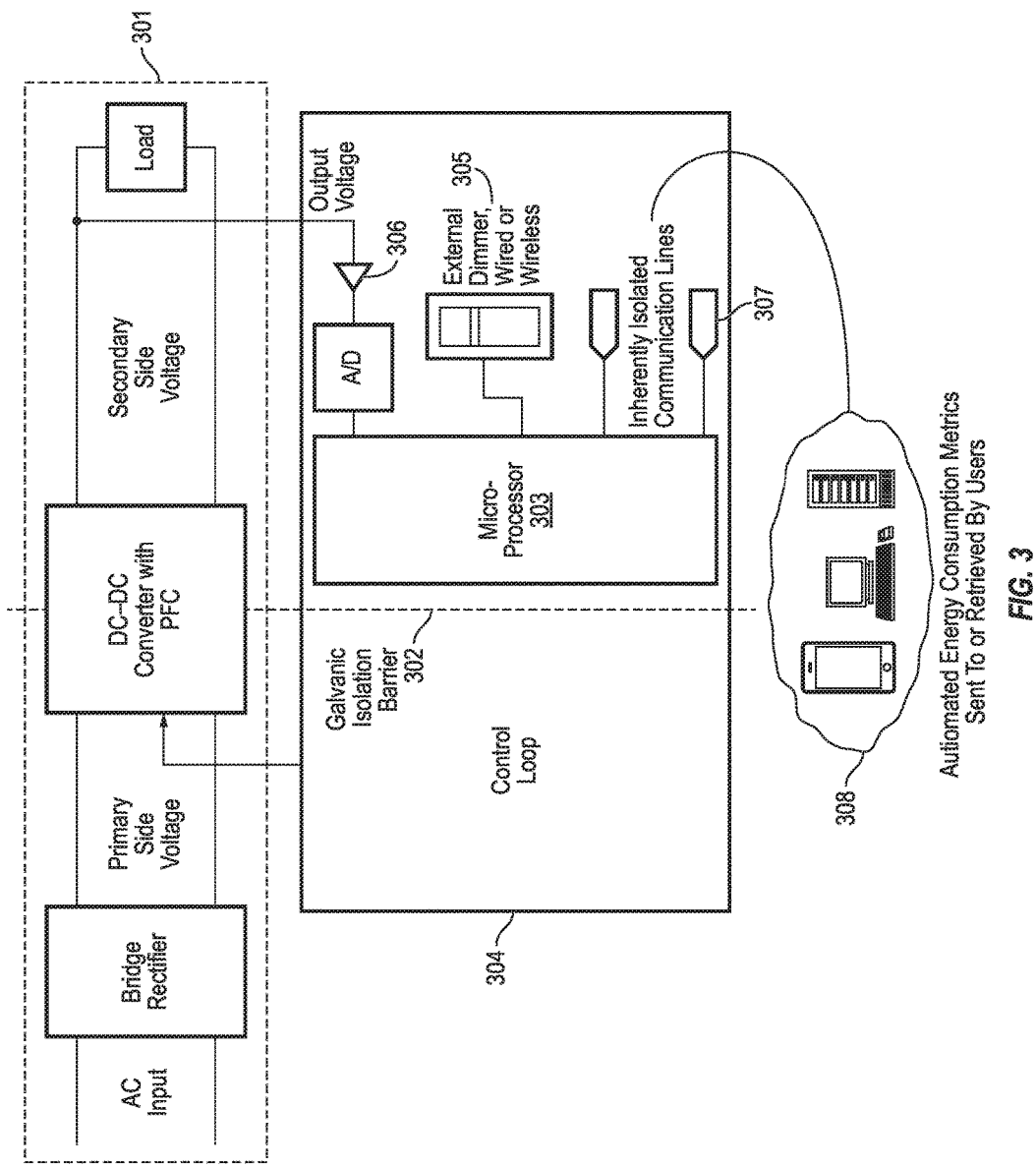
FIG. 3 is a block diagram of a system according to an embodiment of the present invention.

FIG. 3 is a block diagram of a system according to an embodiment of the present invention. Embodiments of the present invention utilize a constant current power supply with active power factor correction (301). The power supply is galvanically isolated (302) between the primary input side, and the secondary output side, for user protection from electrocution. The microprocessor (303), which resides within the control loop used to regulate the power supply (304), sets the specified output current level based on the current value programmed prior to operation, and the real-time external dimming level (305) sent to the microprocessor, either with a wired or wireless dimmer. The microprocessor also has access to the real-time output voltage level, which it measures with an internal analog-to-digital converter (306).

Based on these inputs, the microprocessor can then calculate the cumulative energy emitted and consumed by the power supply. This information can then be conveyed to the outside world via a wired or wireless connection over a network or directly (307). Periodic automated reporting can be configured within the microprocessor, to automatically tell the end user the energy usage metrics, or at any time, the user can poll the microprocessor and see the real time and cumulative energy usage metrics (308).

Embodiments of the present invention may result in low cost. Embodiments of the present invention may have a low component count. Components and signals that are already present may be repurposed. Embodiments of the present invention may utilize low processing power due to calculations being very simple and using input values already stored within the microprocessor's memory.

Embodiments of the present invention may provide for all measurements and processing to be done on the isolated secondary side of the power supply. Further, all communications signals to and from the microprocessor may be inherently isolated and, as such, no extra opto-isolation may be utilized.

Embodiments of the present invention may provide relatively high accuracy if frequent updates are configured and may allow per-node consumption measurements.

Aspects of embodiments according to the present invention relate to a method for measuring power factor correcting (PFC) power supply input power, using a single secondary side measurement with periodic usage metrics. This method may be used in microprocessor-based LED driver products.

A relevant device or component (or relevant devices or components) according to embodiments of the present invention described herein may be implemented utilizing any suitable hardware (e.g., an application-specific integrated circuit), firmware (e.g., a DSP or FPGA), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

A person of skill in the art should also recognize that the process may be executed via hardware, firmware (e.g., via an ASIC), or in any combination of software, firmware, and/or hardware. Furthermore, the sequence of steps of the process is not fixed, but can be altered into any desired sequence as recognized by a person of skill in the art. The altered sequence may include all of the steps or a portion of the steps.

Although this invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the Applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A method of monitoring a power factor correcting (PFC) power supply, the method comprising:
    powering on the PFC power supply with a constant current;
    starting a runtime counter that increments a count value;
    measuring an output voltage;
    calculating an output power by multiplying the constant current by the output voltage;
    storing the output power in a random-access memory (RAM);
    calculating an input power by multiplying the output power by an efficiency curve factor; and
    storing the input power in the RAM.

2. The method of claim 1, wherein the PFC power supply comprises a non-volatile memory; and
    wherein when the count value reaches a set number of counts, the method further comprises:
        calculating an output energy by multiplying the output power by the count value; and
        calculating an input energy by multiplying the input power by the count value.

3. The method of claim 2, further comprising determining whether an output energy value and an input energy value are stored in the non-volatile memory.

4. The method of claim 3, further comprising, upon determining that the output energy value and the input energy value are not stored in the non-volatile memory:
    storing the output energy as the output energy value in the non-volatile memory; and
    storing the input energy as the input energy value in the non-volatile memory.

5. The method of claim 3, further comprising, upon determining that the output energy value and the input energy value are stored in the non-volatile memory:
    adding the output energy to the output energy value and storing as the output energy value in the non-volatile memory; and
    adding the input energy to the input energy value and storing as the input energy value in the non-volatile memory.

6. The method of claim 1, further comprising:
    measuring a dimming level, wherein calculating the output power comprises multiplying the dimming level by a product of the multiplying of the constant current by the output voltage.

7. The method of claim 6, further comprising:
    determining whether an analog-to-digital (A/D) update interrupt flag is present; and
    upon determining that the A/D update interrupt flag is not present, repeating the calculating the output power, storing the output power, calculating the input power, and storing the input power.

8. The method of claim 5, further comprising communicating the output energy value or the input energy value to an energy consumption monitoring system.

9. The method of claim 1, wherein measuring the output voltage is measuring a voltage applied to a load.

10. A power factor correcting (PFC) power supply, comprising:

a power supply configured to receive an AC input at a primary side and generate a supply voltage at a secondary side; and a controller configured to control the level of the supply voltage generated by the power supply, wherein the controller is configured to:
- power on the PFC power supply with a constant current;
- start a runtime counter that increments a count value;
- measure an output voltage;
- calculate an output power by multiplying the constant current by the output voltage;
- store the output power in a random-access memory (RAM);
- calculate an input power by multiplying the output power by an efficiency curve factor; and
- store the input power in the RAM.

11. The PFC power supply of claim 10, further comprising a non-volatile memory, wherein when the count value reaches a set number of counts, the controller is configured to:
- calculate an output energy by multiplying the output power by the count value; and
- calculate an input energy by multiplying the input power by the count value.

12. The PFC power supply of claim 11, wherein the controller is further configured to determine whether an output energy value and an input energy value are stored in the non-volatile memory.

13. The PFC power supply of claim 12, wherein the controller is further configured to, upon determining that the output energy value and the input energy value are not stored in the non-volatile memory:
- store the output energy as the output energy value in the non-volatile memory; and
- store the input energy as the input energy value in the non-volatile memory.

14. The PFC power supply of claim 12, wherein the controller is further configured to, upon determining that the output energy value and the input energy value are stored in the non-volatile memory:
- add the output energy to the output energy value and store the result as the output energy value in the non-volatile memory; and
- add the input energy to the input energy value and store the result as the input energy value in the non-volatile memory.

15. The PFC power supply of claim 10, wherein the controller is further configured to measure a dimming level, wherein calculating the output power comprises multiplying the dimming level by a product of the multiplying of the constant current by the output voltage.

16. The PFC power supply of claim 15, wherein the controller is further configured to:
- determine whether an analog-to-digital (A/D) update interrupt flag is present; and
- upon determining that the A/D update interrupt flag is not present, repeat calculating the output power, storing the output power, calculating the input power, and storing the input power.

17. The PFC power supply of claim 14, wherein the controller is further configured to communicate the output energy value or the input energy value to an energy consumption monitoring system.

18. The PFC power supply of claim 10, wherein measuring the output voltage is measuring a voltage applied to a load.

* * * * *